US007573309B2

(12) United States Patent
Abe

(10) Patent No.: US 7,573,309 B2
(45) Date of Patent: Aug. 11, 2009

(54) WAVEFORM WIDTH ADJUSTING CIRCUIT WITH SELECTIVE CONTROL DELAY

(75) Inventor: Ichiro Abe, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 47 days.

(21) Appl. No.: 11/790,601

(22) Filed: Apr. 26, 2007

(65) Prior Publication Data

US 2007/0252628 A1   Nov. 1, 2007

(30) Foreign Application Priority Data

Apr. 28, 2006   (JP)   ............... 2006-125376

(51) Int. Cl.
*H03K 3/017* (2006.01)
*H03K 5/04* (2006.01)
*H03K 7/08* (2006.01)

(52) U.S. Cl. ............... 327/172; 327/173; 327/174
(58) Field of Classification Search ......... 327/172–174
See application file for complete search history.

(56) References Cited

U.S. PATENT DOCUMENTS 5,672,990 A * 9/1997 Chaw ............... 327/176
5,723,994 A * 3/1998 Ting et al. ............... 327/174
5,969,555 A * 10/1999 Suda ............... 327/172
6,147,532 A * 11/2000 Ueda ............... 327/158
7,030,671 B2 * 4/2006 Park ............... 327/172

* cited by examiner

*Primary Examiner*—Lincoln Donovan
*Assistant Examiner*—John W Poos
(74) *Attorney, Agent, or Firm*—McGinn IP Law Group, PLLC

(57) ABSTRACT

Disclosed is waveform width adjusting circuit that comprises: a delay circuit having a prescribed delay time is provided in a signal propagation path and a delay adjusting circuit which applies an adjustment in such a manner that when a waveform width extending from either a positive-going transition or a negative-going transition of the signal waveform at an input terminal to the next negative-going transition or positive-going transition is greater than the delay time of the delay circuit, a signal having a reduced waveform width is output, and such that when the waveform width of the signal at the input terminal is less than or equal to the delay time, the waveform width is not reduced and the signal that is output has the waveform width of the original signal. Thus, the waveform width of a signal for which the waveform width is less than a limit is not reduced.

24 Claims, 7 Drawing Sheets

WAVEFORM WIDTH ADJUSTING CIRCUIT WITH SELECTIVE CONTROL DELAY

FIELD OF THE INVENTION

This invention relates to a waveform width adjusting circuit for adjusting and outputting the waveform width of an input signal.

BACKGROUND OF THE INVENTION

A circuit illustrated in FIG. 6, by way of example, is known as a typical circuit for outputting an input signal upon reducing the signal waveform width (namely the time, also sometimes referred to as "pulse width", from either a positive-going transition or a negative-going transition of the signal to the negative-going or positive-going transition that occurs following the first-mentioned transition. In a CMOS inverter array (INV11 to INV16) shown in FIG. 6, the value of the ratio between an NMOS transistor and a PMOS transistor (the gain-coefficient ratio $\beta n/\beta p$ of each of the MOS transistors) is changed alternatingly at CMOS inverters in front and back ($\beta n/\beta p = \frac{1}{8}$ in the case of INV11, INV13, INV15 and $\beta n/\beta p = \frac{2}{4}$ in the case of INV12, INV14, INV16), and the transfer speed of a positive-going transition from LOW to HIGH of a signal at an input terminal and the transfer speed of a negative-going transition from HIGH to LOW are made to differ from each other. As a result, the positive-going transition from LOW to HIGH of a signal that is output from a terminal 2 is slowed in accordance with the positive-going transition from LOW to HIGH at terminal 1, and the negative-going transition from HIGH to LOW of a signal that is output from the terminal 2 is hastened in accordance with the negative-going transition from HIGH to LOW at terminal 1. The width of the waveform is reduced by an amount equivalent to the difference between the two delays.

Further, in a circuit illustrated in FIG. 7, a signal from an input terminal 1 is supplied as is to one input of a two-input AND gate 13 and is supplied to a second input of the AND gate 13 via a delay circuit 14. In a case where the signal at input terminal 1 undergoes a LOW-to-HIGH positive-going transition, output terminal 2 does not undergo a change to the HIGH level until the two inputs of AND gate 13 both go HIGH. That is, the positive-going transition at output terminal 2 is delayed by an amount equivalent to the delay of the delay circuit 14 from the timing of the LOW-to-HIGH positive-going transition of the signal at input terminal 1. In a case where the signal at input terminal 1 undergoes a HIGH-to-LOW negative-going transition, the output terminal 2 is placed at the LOW level if either one of the two inputs of AND gate 13 goes LOW. The signal at output terminal 2 therefore falls from HIGH to LOW without any delay from the delay circuit 14. Consequently, the signal waveform at output terminal 2 has its width reduced by an amount equivalent to the difference between the times of the HIGH-to-LOW and LOW-to-HIGH transitions.

The configurations illustrated in FIGS. 6 and 7 always reduce the width of a signal waveform irrespective of the width of the waveform. Consequently, in a case where the width of an input signal waveform is not large enough with respect to the shortened width, the output waveform width is reduced too much and made too narrow. As a result, a problem arises in a circuit (not shown) downstream of the waveform-width adjusting circuit or the maximum amplitude fails to exceed a threshold value in a binary pulse waveform. There is a possibility that the waveform itself may vanish.

SUMMARY OF THE DISCLOSURE

There is a high likelihood that the width of the input signal waveform will fluctuate because of various factors such as voltage conditions and temperature. In the conventional waveform width adjusting circuits illustrated in FIGS. 6 and 7, the width of the waveform can be reduced in a case where the input signal waveform has a width greater than a certain width. However, when the width of the input signal waveform is small, however, the output signal waveform itself may vanish or become too narrow. These problems cannot be solved with the related art.

That is, in the conventional waveform width adjusting circuits, a restriction is imposed upon the input signal waveform, namely that a certain amount of width be assured in regard to all conditions. This means that it is difficult to apply these conventional circuits to high-frequency operation.

Accordingly, it is an object of the present invention to provide a circuit that makes it possible to generate a necessary waveform width even in a case where the waveform width of a signal has been reduced by controlling delay depending upon signal waveform width, as well as a semiconductor integrated circuit device that is equipped with this circuit.

A waveform width adjusting circuit according to the present invention delays an input signal and produces an output signal, the width of the signal waveform whereof has been adjusted, the circuit having means for varying the amount of delay of the output signal, based upon the value of the input signal or the value of the output signal, whereby the width of the output signal waveform is reduced with a preset waveform width serving as a limit.

The circuit according to the present invention includes means for adjusting delay time selectively based upon positive- and negative-going transitions of a waveform; and means for varying delay time in accordance with a time interval between a positive-going transition and a negative-going transition of the waveform. Waveform width is reduced with a prescribed waveform width serving as a limit.

According to one aspect of the present invention, the foregoing object is attained by providing a waveform width adjusting circuit comprising: a circuit that separately controls delay of a positive-going transition of an input signal and delay of a negative-going transition of the input signal to produce a signal having a waveform width from one transition of the positive-going transition and negative-going transition to the other transition adjusted; and a delay adjusting circuit that controls the changeover of adjustment of the waveform width so as to output a signal having a waveform width equal to the waveform width of the input signal without reducing the waveform width when the waveform width of the input signal is less than or equal to a predetermined length of time and to output a signal having a reduced waveform width when the waveform width of the input signal is greater than the predetermined length of time; the waveform width of the signal being reducible up to a preset waveform width serving as a limit.

According to another aspect of the present invention, the foregoing object is attained by providing a waveform width adjusting circuit comprising: a circuit that separately controls delay of a positive-going transition of an input signal and delay of a negative-going transition of the input signal, thereby producing a signal having a waveform width that has been adjusted from one transition of the positive-going transition and negative-going transition to the other transition; a delay circuit having a prescribed delay time in a propagation path of the signal; and a delay adjusting circuit that controls changeover of adjustment of waveform width in such a manner that a signal having a reduced waveform width is output in a case where the waveform width of the input signal is greater than the delay time of the delay circuit, and a signal not having a reduced waveform width is output in a case where the waveform width of the input signal is less than the delay time.

According to a further aspect of the present invention, the foregoing object is attained by providing a waveform width adjusting circuit comprising a first delay circuit and a second delay circuit, which includes a plurality of cascade-connected unit delay elements, connected in series between an input terminal and an output terminal; a variable capacitance element the capacitance value whereof varies depending upon the value of a signal at the input terminal being connected to an output of at least one unit delay element of the second delay circuit; wherein when waveform width of a signal at the input terminal from one transition of a positive-going transition and a negative-going transition to the other transition is greater than delay time of the first delay circuit, the capacitance of the variable capacitance element is set to a first value and delay of the second delay circuit is made relatively large with respect to the one transition, and the capacitance of the variable capacitance element is set to a second value and the delay of the second delay circuit is made relatively small with respect to the other transition, whereby a signal having a reduced waveform width is output from the output terminal; and when the waveform width of the signal at the input terminal is less than the delay time of the first delay circuit, the capacitance of the variable capacitance element is made the same value with respect to both the one transition and the other transition, whereby a signal not having a reduced waveform width is output from the output terminal.

In the present invention, the variable capacitance element is a MOS capacitor comprising a MOS transistor having a gate connected to the output of a unit delay element of the delay circuit array, and a source and drain coupled together and connected to the signal at the input terminal or to a signal that is the inverse of this signal.

According to yet another aspect of the present invention, the foregoing object is attained by providing a waveform width adjusting circuit comprising a first delay circuit, which includes a plurality of cascade-connected unit delay elements, and a second delay circuit connected in series between an input terminal and an output terminal; a variable capacitance element the capacitance value whereof varies depending upon the value of a signal at the output terminal being connected to an output of at least one unit delay element of the first delay circuit; wherein when waveform width of a signal at the input terminal from one transition of a positive-going transition and a negative-going transition to the other transition is greater than the total of delay time of the first delay circuit and delay time of the second delay circuit, the capacitance of the variable capacitance element is made a first value and delay of the first delay circuit is made relatively large with respect to the one transition, and the capacitance of the variable capacitance element is made a second value and the delay of the first delay circuit is made relatively small with respect to the other transition, whereby a signal having a reduced waveform width is output from the output terminal; and when the waveform width of the signal at the input terminal is less than the total of delay time of the first delay circuit and delay time of the second delay circuit, the capacitance of the variable capacitance element is made the same value with respect to the one transition and the other transition, whereby a signal not having a reduced waveform width is output from the output terminal.

In the present invention, the variable capacitance element is a MOS capacitor comprising a MOS transistor having a gate connected to the output of a unit delay element of the delay circuit array, and a source and drain coupled together and connected to the signal at the output terminal or to a signal that is the inverse of this signal.

In the present invention, the unit delay element comprises an inverter.

According to a further aspect of the present invention, the foregoing object is attained by providing a waveform width adjusting circuit comprising the following circuits between an input terminal and an output terminal: a first delay circuit; a second delay circuit which receives an output of the first delay circuit; a selecting circuit, which has first and second inputs connected to an output of the second delay circuit and to the output of the first delay circuit, for selecting and outputting one of the first and second inputs in accordance with the value of a signal at the input terminal; and a logic circuit which receives outputs of the first delay circuit and selecting circuit, and which has an output connected to the output terminal; wherein when waveform width of the signal at the input terminal from one transition of a positive-going transition and a negative-going transition to the other transition is greater than the total of delay time of the first delay circuit and delay time of the second delay circuit, the selecting circuit selects the first input with respect to the one transition and selects the second input with respect to the other transition, whereby a signal having a reduced waveform width is output from the output terminal; and when the waveform width of the signal at the input terminal is less than the total of delay time of the first delay circuit and delay time of the second delay circuit, the selecting circuit selects the same input with respect to both the one transition and the other transition, whereby a signal not having a reduced waveform width is output from the output terminal.

In accordance with yet another aspect of the present invention, the foregoing object is attained by providing a semiconductor integrated circuit device having a waveform width adjusting circuit according to the present invention described above.

The meritorious effects of the present invention are summarized as follows.

In accordance with the present invention, a waveform width adjusting circuit is provided with a function whereby when the width of a waveform is reduced, the reduction being performed with a prescribed waveform width serving as a limit. This solves the problems of the related art, namely failure to obtain the necessary waveform width or extinction of the waveform itself because the waveform width of the input signal is too small.

Other features and advantages of the present invention will be apparent from the following description taken in conjunction with the accompanying drawings, in which like reference characters designate the same or similar parts throughout the figures thereof.

EXAMPLES OF THE INVENTION

Figure 1:
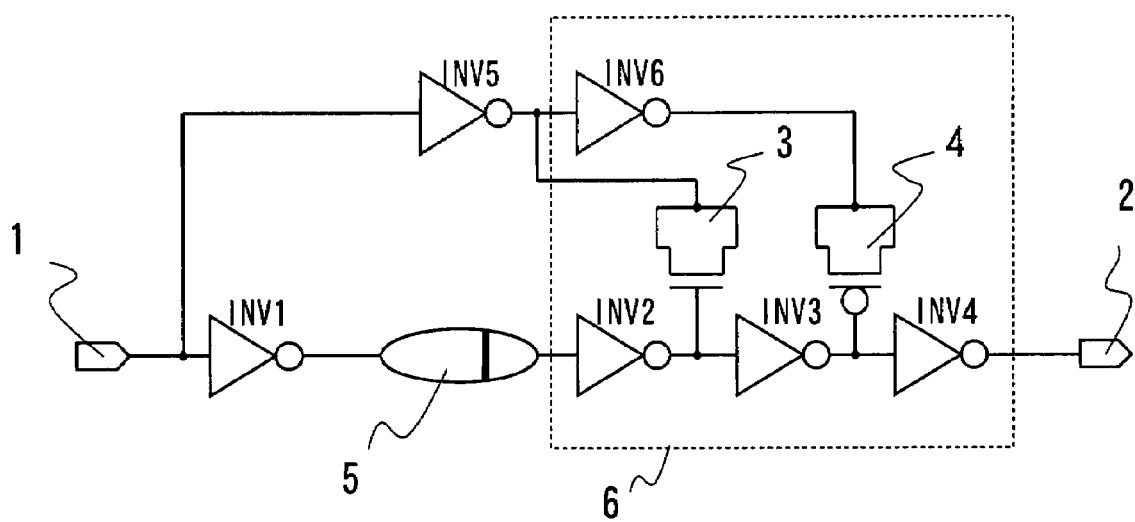
FIG. 1 is a diagram illustrating the configuration of a first example of the present invention.

Examples of the present invention will be described in detail with reference to the accompanying drawings. The present invention provides a circuit having a MOS capacitor in order to add capacitance to a signal path and variably adjust delay time using the signal at an input terminal or the signal at an output terminal. By controlling the capacitance value of the MOS capacitor, control is exercised so as to reduce waveform width using a specific waveform width as a limit. According to the present invention, the path on which the signal, the waveform width thereof being adjusted propagates is provided with a delay circuit (5) having a prescribed delay time. Further provided is a delay adjusting circuit (6) that applies an adjustment in such a manner that when a waveform width that is a length of time from one transition of the signal waveform to the next, namely from either a positive-going transition or a negative-going transition of the signal waveform to the next negative-going transition or positive-going transition, is greater than the delay time of the delay circuit (5), a signal having a reduced waveform width is output, and such that when the waveform width from one transition to the next is less than the delay time, the waveform width is not reduced and the signal that is output has the waveform width of the original signal.

In the present invention, the first delay circuit (5) and a second delay circuit, which comprises a delay circuit array that includes a plurality of cascade-connected unit delay elements (INV2, INV3, INV4), are connected in series between an input terminal (1) and an output terminal (2). Variable capacitance elements (3, 4) the capacitance values whereof vary depending upon the value of the signal at the input terminal (1) are connected to the outputs of unit delay elements (INV2, INV3) of the second delay circuit. When the waveform width of the signal at the input terminal (1) from one transition of the signal to the next, namely from either a positive-going transition or a negative-going transition of the signal to the next negative-going transition or positive-going transition, is greater than delay time (td) of the first delay circuit (5), the capacitances of the variable capacitance elements (3, 4) are made relatively large and the delay of the second delay circuit comprising the delay circuit array (INV2, INV3, INV4) is made relatively large with respect to one transition, and the capacitances of the variable capacitance elements (3, 4) are made relatively small and the delay of the second delay circuit comprising the delay circuit array (INV2, INV3, INV4) is made relatively small with respect to the next transition, whereby a signal having a reduced waveform width is output from the output terminal (2). On the other hand, when the waveform width of the signal at the input terminal (1) is less than the delay time of the first delay circuit (5), the capacitances of the variable capacitance elements (3, 4) are both made the same value, e.g., relatively small, and the delay is made relative small with respect to both the one transition and the next, whereby a signal not having a reduced waveform width is output from the output terminal (2).

In the present invention, each variable capacitance element is a capacitor comprising a MOS transistor having a gate connected to the delay circuit array, and a source and drain coupled together and connected to the signal at the input terminal or to a signal that is the inverse of this signal.

In another example of the present invention, a first delay circuit, which comprises a delay circuit array that includes a plurality of cascade-connected unit delay elements (INV2, INV3, INV4), and a second delay circuit (5) are connected in series between an input terminal (1) and an output terminal (2). Variable capacitance elements (3, 4) the capacitance values whereof vary depending upon the value of the signal at the output terminal (2) are connected to the outputs of unit delay elements (INV2, INV3) of the first delay circuit. When the waveform width of the signal at the input terminal (1) from one transition of the signal to the next, namely from either a positive-going transition or a negative-going transition of the signal to the next negative-going transition or positive-going transition, is greater than the total of the delay time of the first delay circuit and delay time of the second delay circuit, the capacitances of the variable capacitance elements (3, 4) are made relatively large and the delay of the first delay circuit is made relatively large with respect to one transition, and the capacitances of the variable capacitance elements (3, 4) are made relatively small and the delay of the first delay circuit is made relatively small with respect to the next transition, whereby a signal having a reduced waveform width is output from the output terminal (2). On the other hand, when the waveform width of the signal at the input terminal (1) is less than the total of the delay time of the first delay circuit and delay time of the second delay circuit, the capacitances of the variable capacitance elements (3, 4) are both made the same value, e.g., relatively small, and the delay is made relative small with respect to both the one transition and the next, whereby a signal not having a reduced waveform width is output from the output terminal (2).

In a further example of the present invention, a waveform width adjusting circuit comprises the following circuits between an input terminal (1) and an output terminal (2): a first delay circuit (5); a second delay circuit (11) which receives an output of the first delay circuit; a selecting circuit (12), which has first and second inputs (A and B, respectively) connected to an output of the second delay circuit (11) and to the output of the first delay circuit (5), for selecting and outputting one of the first and second inputs in accordance with the value of a signal at the input terminal; and a logic circuit (10) which receives outputs of the first delay circuit (5) and selecting circuit (12), and which has an output connected to the output terminal. When the waveform width of the signal at the input terminal from one transition of the signal to the next, namely from either a positive-going transition or a negative-going transition of the signal to the next negative-going transition or positive-going transition, is greater than the total of the delay time of the first and second delay circuits (5, 11), the selecting circuit (12) selects the first input (A) with respect to the one transition and selects the second input (B) with respect to the next transition, whereby a signal having a reduced waveform width is output from the output terminal. On the other hand, when the waveform width of the signal at the input terminal is less than the total of the delay time of the first and second delay circuits (5, 11), the selecting circuit (12) selects, e.g., the second input (B) as the same input with respect to the one transition and the next, whereby a signal not having a reduced waveform width is output from the output terminal. Thus, in accordance with the present invention, control for reducing waveform width is performed with a prescribed waveform width serving as a limit. This solves the problems of the related art, namely failure to obtain the necessary waveform width or extinction of the waveform itself because the waveform width of the input signal is too small. This control is well suited to application to high-frequency operation.

FIG. 1 is a diagram illustrating the configuration of an example of the present invention. As shown in FIG. 1, this example includes an inverter INV1 having its input connected to an input terminal 1; a delay circuit 5 (which functions in such a manner that the delay time thereof stipulates the limit on waveform width) connected to the output of the inverter INV1; an inverter array made up of three inverters INV2, INV3, and INV4 cascade-connected between the output of the delay circuit 5 and an output terminal 2; an inverter INV5 having its input connected to the input terminal 1; an inverter INV6 having its input connected to the output of the inverter INV5; an NMOS transistor 3 (NMOS capacitor) having its gate connected to the output of the inverter INV2 and having its drain and source coupled together and connected to the output of the inverter INV5; and a PMOS transistor 4 (PMOS capacitor) having its gate connected to the output of the inverter INV3 and having its drain and source coupled together and connected to the output of the inverter INV6.

In this example, the MOS capacitors 3 and 4 are controlled with a signal that has been supplied to the input terminal 1 serving as a decision signal. Owing to such control, the delay time of a delay adjusting unit 6 is varied selectively and the waveform width of the signal that is output from the output terminal 2 is adjusted.

When the input terminal 1 undergoes a change from LOW to HIGH (a positive-going transition) in a case where a HIGH one-shot pulse is supplied to the input terminal 1, the outputs of the inverters INV5 and INV6 go LOW and HIGH, respectively, and the NMOS transistor 3 and PMOS transistor 4 both undergo an increase in gate capacitance in comparison with when the input terminal 1 is LOW. As a result, there is an increase in the propagation delay time of the inverter array (INV2, INV3, INV4).

If the input terminal 1 is HIGH until the LOW-to-HIGH transition edge at the input terminal 1 reaches the delay adjusting unit 6, the positive-going transition to HIGH of the signal at the output terminal 2 is delayed.

If the input terminal 1 undergoes a change from HIGH to LOW (a negative-going transition), the outputs of the inverters INV5 and INV6 go HIGH and LOW, respectively, the NMOS transistor 3 and PMOS transistor 4 both undergo a decrease in gate capacitance, the delay time of the inverter array (INV2, INV3, INV4) decreases and hence the HIGH-to-LOW negative-going transition of the signal at the output terminal 2 is hastened. As a result, the waveform width of the signal from the output terminal 2 is reduced in comparison with the waveform width of the signal at the input terminal 1 by an amount equivalent to the difference between the delay of the LOW-to-HIGH positive-going transition of the signal at output terminal 2 and the delay of the HIGH-to-LOW negative-going transition of this signal at output terminal 2.

On the other hand, if the input terminal 1 should happen to go from HIGH to LOW before the LOW-to-HIGH positive-going transition edge at the input terminal 1 reaches the delay adjusting unit 6 via the delay circuit 5, the capacitances of the MOS capacitors 3 and 4 decrease in comparison with when the input terminal 1 was at the HIGH level, the propagation delay time of the inverter array (INV2, INV3, INV4) decreases with respect to the positive-going transition and negative-going transition of the signal that is supplied to the delay adjusting unit 6 via the delay circuit 5, the waveform is not narrowed and the waveform width never becomes a waveform width less than the delay in the signal change caused by the delay circuit 5. This means that it is possible to reduce the waveform width using the waveform width decided by the delay circuit 5 as a limit.

The delay adjusting unit 6 has one or more of the NMOS transistor 3 and PMOS transistor 4 whose gates are connected to the signal transfer portions and functions to adjust the amount of delay of the input signal as follows: When the signal at the input terminal 1 goes from LOW to HIGH, the source-drain voltage of NMOS transistor 3 goes LOW, the source-drain voltage of the PMOS transistor 4 goes HIGH and the capacitance values of the gate capacitances of the transistors increase in out-of-phase fashion. Let this be State 1.

When State 1 is in effect, the load on the inverters INV2 and aINV3 of the delay adjusting unit 6 increases, the amount of delay increases as well and the speed at which the change in the signal is transferred to the output terminal 2 declines.

When the signal at input terminal 1 goes from HIGH to LOW, the source-drain voltage of NMOS transistor 3 goes HIGH, the source-drain voltage of the PMOS transistor 4 goes LOW and the capacitance values of the gate capacitances decrease as compared with State 1. Let this be State 2.

When State 2 is in effect, the load on the inverters INV2 and INV3 of the delay adjusting unit 6 decreases, the amount of delay decreases and the speed at which the change in the signal is transferred to the output terminal 2 rises.

In this example, the delay circuit 5 is provided between the input terminal 1 and the delay adjusting unit 6. If the delay times of the inverters INV1 and INV5 are made identical, the signal transmitted over the path (inverter INV1 and delay circuit 5) of the wiring that enters the delay adjusting unit 6 from the input terminal 1 is delayed, relative to the signal transmitted over the capacitance control path (inverter INV5), by the amount of delay of delay circuit 5.

The operation of the waveform width adjusting circuit will now be described with reference to the waveform diagram of FIG. 2. Reference numerals 1, 6 and 2 in FIG. 2 represent the input waveform at input terminal 1 in FIG. 1, the waveform that enters the delay adjusting unit 6 from the delay circuit 5 and the waveform at output terminal 2, respectively.

A case where the waveform at input terminal 1 is a one-shot pulse waveform that goes from LOW to HIGH and then returns to LOW will be described as an example. The waveform is delivered to the delay adjusting unit 6 upon being subjected to a fixed delay (td), relative to the signal at input terminal 1, by the delay circuit 5.

Figure 2:
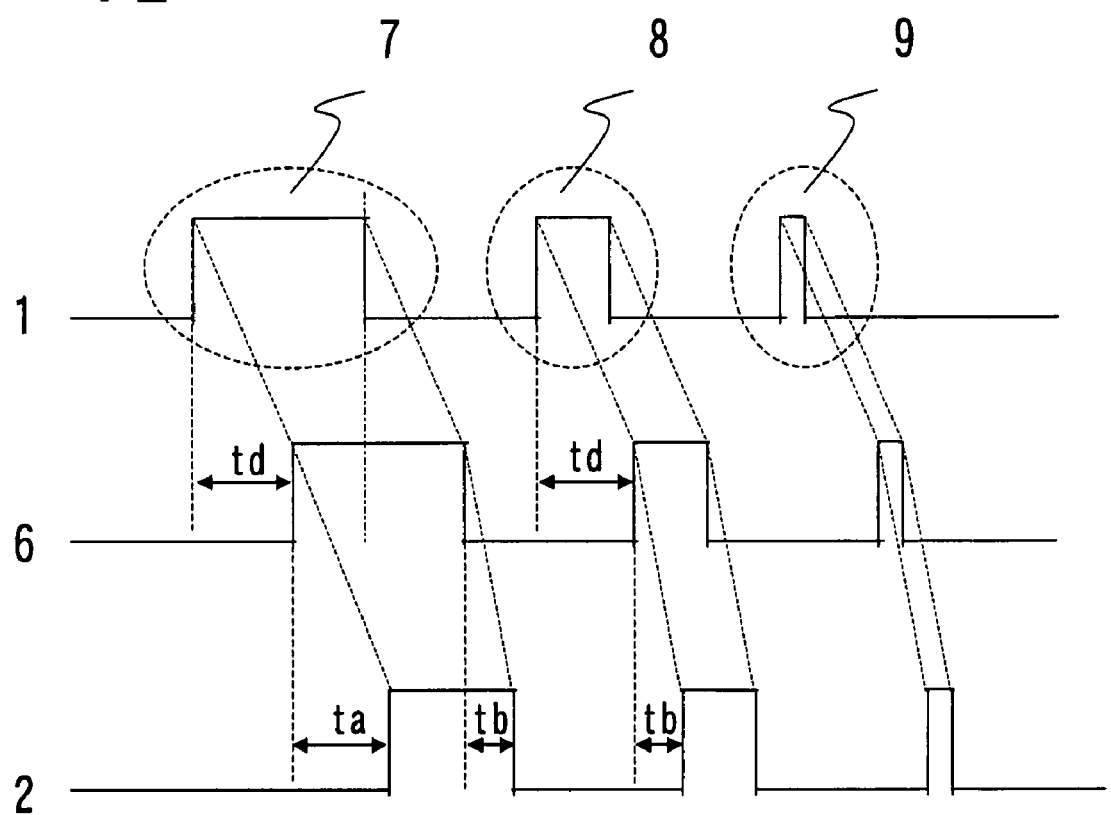
FIG. 2 is a waveform diagram useful in describing the operation of the first example.

In a case where the signal at input terminal 1 has the waveform 7 in FIG. 2, the input terminal 1 is HIGH when a rising signal (rising edge) to HIGH is transmitted to the delay adjusting unit 6. The signal therefore reaches the output terminal 2 with a large delay (ta). When a signal falling to LOW is transmitted to the delay adjusting unit 6, the input terminal 1 is LOW. The signal therefore reaches the output terminal 2 with a small delay (tb). In the delay adjusting unit 6, therefore, the rising signal propagates with the delay amount which is greater than that of the falling signal and hence the waveform width of waveform 7 at output terminal 2 is reduced.

On the other hand, in a case where waveforms 8 and 9 having small pulse widths are supplied as the signal to input terminal 1 (the pulse widths of waveforms 8 and 9 are smaller than the delay time td of the delay circuit 5), the input terminal 1 is LOW when a signal rising from LOW to HIGH is being transmitted by the delay adjusting unit 6. The capacitances of the MOS capacitors 3 and 4 decrease, therefore, and the signal reaches the output terminal 2 upon sustaining a small delay (tb). Since the input terminal 1 is LOW also when a falling signal from HIGH to LOW is transmitted to the delay adjusting unit 6, the signal reaches the output terminal 2 upon similarly with a small delay (tb). In this case, the rising and falling edges of the signal in the delay adjusting unit 6 have the same amount of delay and hence there is no change in the width of the signal waveform at the output terminal 2.

Thus, in a case where the signal waveform at input terminal 1 maintains the HIGH level while a signal is passing through the delay circuit 5, the width of the signal waveform at output terminal 2 is reduced. On the other hand, in a case where the signal waveform at input terminal 1 changes from HIGH to LOW while a signal is passing through the delay circuit 5, the width of the signal waveform at output terminal 2 is not reduced. That is, when the waveform width of a signal is greater than the amount of data in delay circuit 5, the width of the signal is reduced. When the waveform width of the signal is less than the amount of delay, the width of the signal is not reduced.

Thus, in this example, a waveform width (pulse width) from the moment the input terminal 1 rises to HIGH until the moment it falls to LOW shortens the output waveform relative to the input waveform with the limit being the width of the waveform that conforms to the delay time of the delay circuit 5. The delay circuit 5 may be so adapted that the delay time thereof is variable, and it may be so arranged that the limit of the waveform width is adjusted by the engineer in accordance with the particular application.

Further, in a case where the width of a signal waveform is reduced selectively, in the manner described above, with respect to a one-shot pulse in which the waveform of the input signal goes from HIGH to LOW and then returns to HIGH, it will suffice to change the configuration of the delay adjusting unit 6 in such a manner that the amount of delay is small when the input signal is LOW and large when the input signal is HIGH. For example, an arrangement in which the NMOS transistor 3 and PMOS transistor 4 are interchanged may be adopted.

In accordance with this example, the circuit has a function for changing the amount of delay depending upon the rising and falling edges of a waveform. A signal can be output upon reducing the width of the input waveform. In a case where the waveform has less than a prescribed width, the signal can be output without reducing the width of the waveform.

Figure 3:
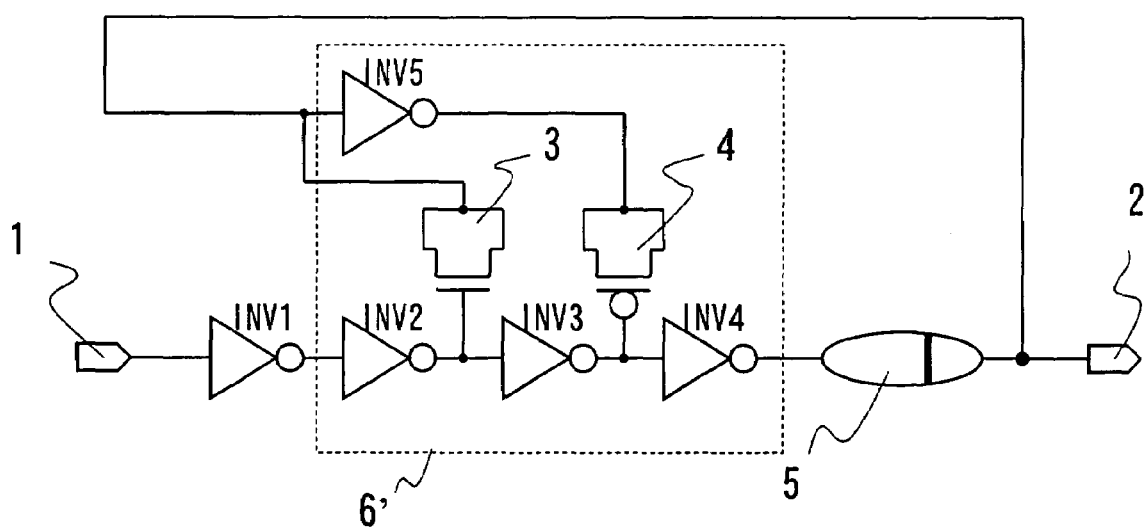
FIG. 3 is a diagram illustrating the configuration of a second example of the present invention.

Next, a second example of the present invention will be described in detail with reference to the drawings. FIG. 3 is a block diagram illustrating the configuration of a second example of the present invention. In the first example described above, delay is adjusted using the input signal at the input terminal 1. In this example, however, delay is adjusted using the output signal at the output terminal 2. As shown in FIG. 3, the example includes the inverter INV1 having its input connected to the input terminal 1; the inverter array of three inverters INV2, INV3 and INV4 cascade-connected to the output of the inverter INV1; the delay circuit 5 (which stipulates the limit on waveform width) connected to the output of the inverter INV4; the output terminal 2 connected to the output of the delay circuit 5; the inverter INV5 connected to the output of the delay circuit 5; the NMOS transistor 3 (NMOS capacitor) having its gate connected to the output of the inverter INV2 and having its drain and source coupled together and connected to the output (output terminal 2) of the delay circuit 5; and the PMOS transistor 4 (PMOS capacitor) having its gate connected to the output of the inverter INV3 and having its drain and source coupled together and connected to the output of the inverter INV5. In this example, the signal from the output terminal 2 is supplied to a delay adjusting unit 6' and is utilized as a signal that varies the capacitance value of the MOS capacitor, thereby adjusting the amount of delay.

When the output terminal 2 is LOW, the gate capacitances of the NMOS transistor 3 and PMOS transistor 4 increase and the propagation delay time of the inverter array (INV2, INV3, INV4) increases in comparison with a case where the output terminal 2 is HIGH. When the output terminal 2 is HIGH, the gate capacitances of the NMOS transistor 3 and PMOS transistor 4 decrease and the propagation delay time of the inverter array (INV2, INV3, INV4) decreases. The circuit functions to reduce waveform width with respect to a one-shot pulse that goes from LOW to HIGH and then returns to LOW. However, waveform width is not reduced with respect to a signal narrower than the waveform width stipulated by the delay adjusting unit 6' and delay circuit 5. Operation will be described with reference to the waveform diagram of FIG. 4. Reference numerals 1, 5 and 2 in FIG. 4 represent the input waveform at input terminal 1 in FIG. 3, the waveform that enters the delay circuit 5 and the waveform at output terminal 2, respectively.

In a case where the signal waveform at input terminal 1 is a one-shot pulse waveform that goes from LOW to HIGH and then returns to LOW, initially the output terminal 2 is LOW. Accordingly, the capacitances of the MOS capacitors 3 and 4 of delay adjusting unit 6' increase, the amount of delay of the inverter array (INV2, INV3, INV4) increases and the time it takes for the LOW-to-HIGH positive-going transition to be transmitted to the output terminal 2 lengthens.

Figure 4:
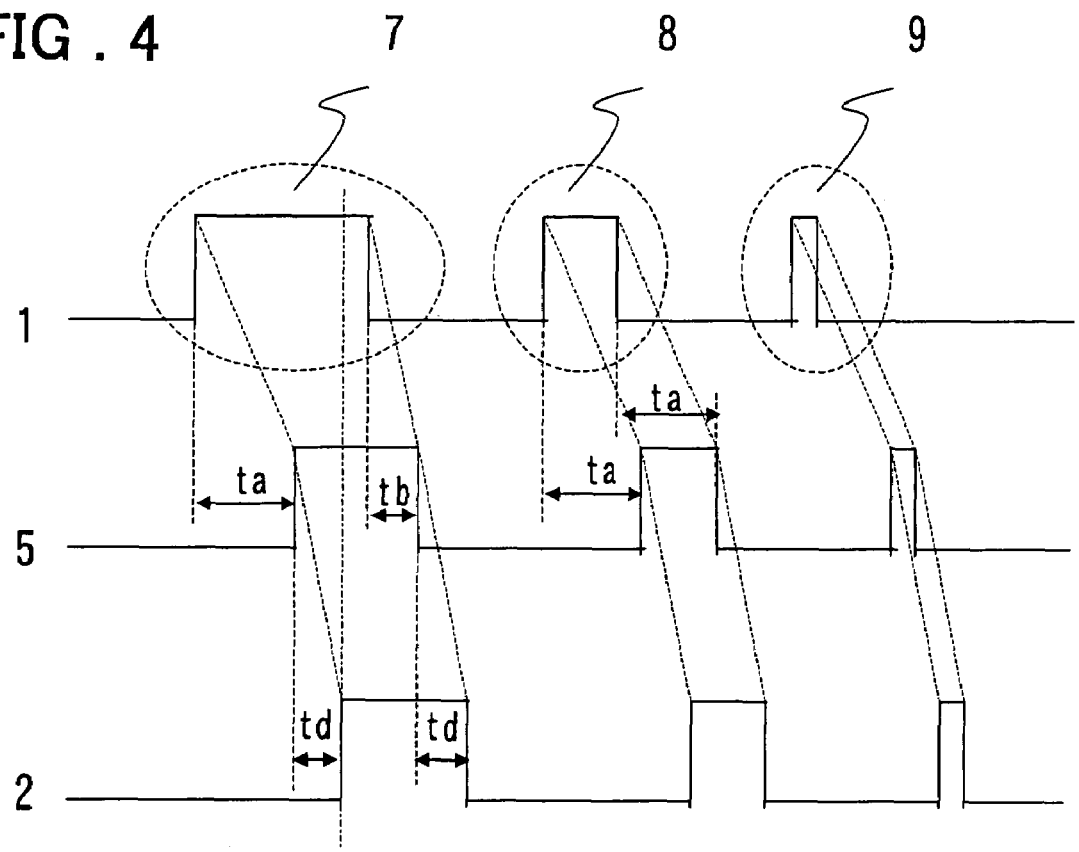
FIG. 4 is a waveform diagram useful in describing the operation of the second example.

All of the positive-going edges of waveforms 7, 8 and 9 in FIG. 4 propagate with a large delay (ta) because the output terminal 2 is LOW.

In a case where output terminal 2 has changed to HIGH in level at the time of the HIGH-to-LOW negative-going transition of the signal waveform at input terminal 1, the capacitances of the MOS capacitors 3 and 4 of delay adjusting unit 6' decrease, the amount of delay of the inverter array (INV2, INV3, INV4) decreases and the HIGH-to-LOW negative-going transition edge at input terminal 1 is transmitted to the output terminal 2 upon sustaining a small delay (tb).

On the other hand, if the output terminal 2 remains LOW in level at the time of the HIGH-to-LOW negative-going transition of the signal waveform at input terminal 1, the capacitances of the MOS capacitors 3 and 4 of delay adjusting unit 6' are large and therefore the amount of delay remains large and the HIGH-to-LOW negative-going transition edge propagates with the large delay (ta).

In the former case (the case where the output terminal 2 has changed to HIGH in level at the time of the HIGH-to-LOW negative-going transition of the signal waveform at input terminal 1), the amounts of delay of the positive-going transition and negative-going transition of the output of delay adjusting unit 6' (inverter INV4) (the input to the delay circuit 5) are ta and tb, respectively, and therefore are different. The width of the waveform is reduced by the amount of the difference between these two delays.

In the latter case (the case where the output terminal 2 is still at the LOW level at the time of the HIGH-to-LOW negative-going transition of the signal waveform at input terminal 1), the amounts of delay of the positive-going transition and negative-going transition are both ta and therefore are not different. Accordingly, there is no change in the waveform width of the signal at output terminal 2.

In a case where the signal waveform at input terminal 1 is waveform 7, the output terminal 2 is HIGH at the time of the HIGH-to-LOW negative-going transition of the signal waveform. The signal at the output terminal 2, therefore, is reduced in waveform width. On the other hand, in a case where the signal waveform at input terminal 1 is waveform 8 or 9, the output terminal 2 remains LOW at the time of the HIGH-to-LOW negative-going transition of the signal waveform. The width of signal waveform at output terminal 2, therefore, is the same as the width of signal waveform at input terminal 1.

Accordingly, in a case where waveform width is less than the width stipulated by the total of the delay time of delay adjusting unit 6' and delay time of delay circuit 5, the waveform is not narrowed.

In the first example illustrated in FIG. 1, the limit of the waveform width is decided solely by the delay circuit 5. In the second example, however, the amount of data applied by the delay adjusting unit 6' also influences the limit of waveform width. There is also a case where the delay circuit 5 is unnecessary or can be shortened depending upon the limit of the desired waveform width and the amount of delay in delay adjusting unit 6'. It should be noted that although the delay circuit 5 can be eliminated in such case, there is a certain restriction, namely that a limit on waveform width less than the amount of delay in delay adjusting unit 6' cannot be stipulated.

Figure 5:
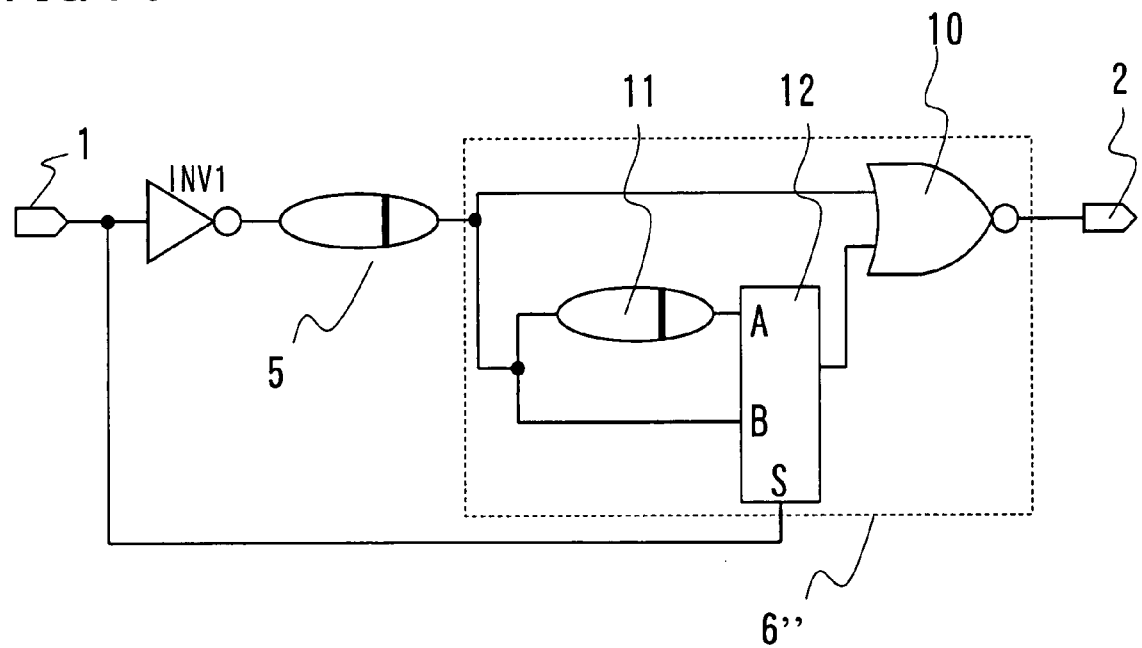
FIG. 5 is a diagram illustrating the configuration of a third example of the present invention.
Figure 6:
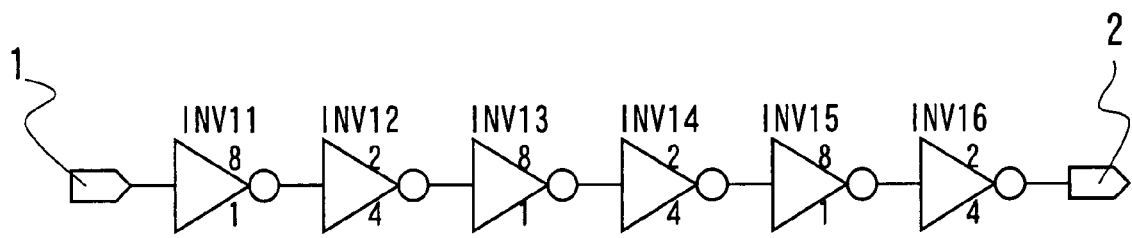
FIG. 6 is a diagram illustrating an example of the configuration of a waveform width adjusting circuit according to the related art.
Figure 7:
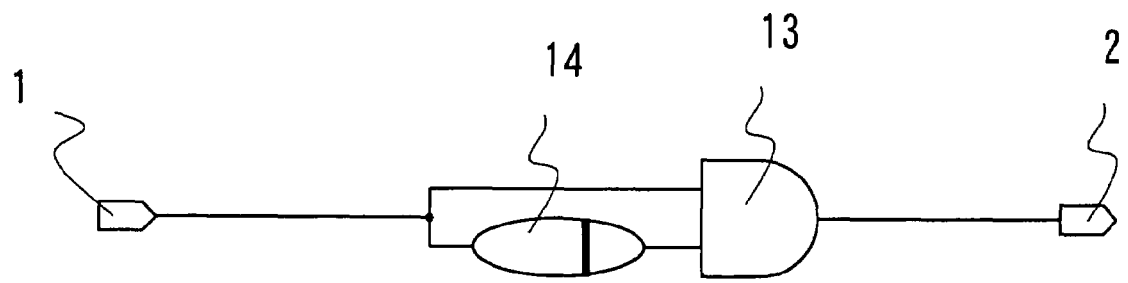
FIG. 7 is a diagram illustrating another example of the configuration of a waveform width adjusting circuit according to the related art.

Next, a third example of the present invention will be described in detail with reference to the drawings. FIG. 5 is a diagram illustrating the configuration of a waveform width adjusting circuit according to a third example of the present invention. In the first example, delay is adjusted by changing the capacitances of the MOS transistors 3 and 4 in the delay adjusting unit 6. In the third example, delay is adjusted using a NOR gate 10. Depending upon the logic, another logic gate, e.g., a NAND gate, may be used instead of the NOR gate 10. For example, if the inverter INV1 in FIG. 5 is absent, a NAND gate is used.

As shown in FIG. 5, the circuit includes the inverter INV1 having its input connected to the input terminal 1; the delay circuit 5 connected to the output of the inverter INV1; a delay circuit 11 connected to the output of the delay circuit 5; a selecting circuit 12 having terminals A and B connected to the output of the delay circuit 11 and to the output of the delay circuit 5, respectively, and a terminal S connected to the input terminal 1; and the NOR gate 10 the inputs to which are the output of the delay circuit 5 and the output of the selecting circuit 12.

The selecting circuit 12 outputs the signal at terminal A if HIGH is applied to the terminal S and outputs the signal at terminal B if LOW is applied to the terminal S. The delay circuit 11 is inserted into the path of terminal A. When the input terminal 1 is HIGH, the path that contains the delay circuit 11 is selected and the transition of the signal at output terminal 2 is delayed in accordance with the amount of delay in delay circuit 11. When the input terminal 1 is LOW, the path that does not have the delay circuit 11 (namely the path having only inverter INV1 and delay circuit 5) is selected. The amount of delay, therefore, is less than when the input terminal 1 was HIGH.

Thus, the operation of a delay adjusting unit 6" is basically the same as that of the delay adjusting unit of the first example. The width of the signal at input terminal 1 that rises from LOW to HIGH and then falls to LOW reduces the width of the output signal with respect to the waveform of the input signal with the width of the waveform that conforms to the amount of delay of delay circuit 5 serving as the limit.

More specifically, in a case where a one-shot pulse waveform applied to the input terminal 1 is the waveform 7 in FIG. 2, the output of inverter INV1 goes LOW when the input terminal 1 goes from LOW to HIGH. Terminal A is selected by the selecting circuit 12, which outputs a signal whose delay time is the total of the delay time of delay circuit 5 and delay time of delay circuit 11. The output of the NOR gate 10 is HIGH when the output of delay circuit 5 is LOW and the output of selecting circuit 12 is LOW. When the input terminal 1 goes from HIGH to LOW (the selecting circuit 12 selects terminal B), the output of the delay circuit 5 (the input to the NOR gate 10) goes from LOW to HIGH after the delay time of the delay circuit 5 and the output of NOR gate 10 goes from HIGH to LOW.

On the other hand, assume a case where the signal at input terminal 1 is waveform 8 or 9 in FIG. 2. After elapse of the total delay time of delay circuits 5 and 11 from the positive-going transition of the signal at input terminal 1, the signal at input terminal 1 is LOW at the moment the output of delay circuit 11 transitions to the LOW level. The selecting circuit 12 therefore selects terminal B, the two inputs to the selecting circuit 12 both go LOW after elapse of the delay time of delay circuit 5 from the positive-going transition of the signal at input terminal 1, and the output of the NOR gate 10 goes HIGH. Further, the inputs to the NOR gate 10 go HIGH upon elapse of the delay time of delay circuit 5 from the HIGH-to-LOW negative-going transition of the signal at input terminal 1, and the signal at output terminal 2 falls to the LOW level. In this case, the width of the signal waveform is not reduced.

The delay adjusting unit 6" may be implemented by other logic so long as it changes over the amount of delay in accordance with whether the input is HIGH or LOW. Further, depending upon the particular application, the amount of delay applied at the time of a LOW input may be made larger than that applied at the time of a HIGH input. The present invention is well suited for application to adjustment of waveform width in a semiconductor device.

Though the present invention has been described in accordance with the foregoing examples, the invention is not limited to this example and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A waveform width adjusting circuit comprising:
   a circuit that separately controls delay of a positive-going transition of an input signal and delay of a negative-going transition of the input signal to produce a signal having a waveform width, from one transition of the positive-going transition and negative-going transition to an other transition, adjusted, and
   that controls a changeover of adjustment of a waveform width so as to output a signal having a waveform width equal to a waveform width of the input signal without reducing the waveform width when the waveform width of the input signal is less than or equal to a predetermined length of time and to output a signal having a reduced waveform width when the waveform width of the input signal is greater than the predetermined length of time.

2. The waveform width adjusting circuit according to claim 1, wherein said circuit includes a delay circuit that has a prescribed delay time in a propagation path of the signal, and
   a delay adjusting circuit controlling the changeover of adjustment of the waveform width in such a manner that a signal having a reduced waveform width is output in a case where the waveform width of the input signal is greater than the delay time of said delay circuit, and a signal not having a reduced waveform width is output in a case where the waveform width of the input signal is less than the delay time.

3. A waveform width adjusting circuit comprising:
   a first delay circuit;
   a second delay circuit that includes a plurality of cascade-connected unit delay elements;
   said first and second delay circuits connected in series between an input terminal and an output terminal; and
   a variable capacitance element, a capacitance value of which varies depending upon a value of a signal at the input terminal and which is connected to an output of at least one unit delay element of said second delay circuit;
   wherein when a waveform width of a signal at the input terminal, from one transition of a positive-going transition and a negative-going transition to the other one of the transitions, is greater than a delay time of the first delay circuit, a capacitance of the variable capacitance element is made a first value and delay of said second delay circuit is made relatively large with respect to said one transition, and the capacitance of the variable capacitance element is made a second value and the delay of said second delay circuit is made relatively small with respect to said other transition, whereby a signal having a reduced waveform width is output from the output terminal, and
   when the waveform width of the signal at the input terminal is less than or equal to the delay time of said first delay circuit, the capacitance of the variable capacitance element is made the same value with respect to both said one transition and said other transition, whereby a signal not having a reduced waveform width is output from the output terminal.

4. The circuit according to claim 3, wherein the variable capacitance element comprises a MOS capacitor comprising a MOS transistor having a gate connected to an output of a unit delay element of the delay circuit, and a source and drain coupled together and connected to the signal at the input terminal or to a signal obtained by inverting the signal at the input terminal.

5. The waveform width adjusting circuit according to claim 3, wherein said first delay circuit is provided succeeding to said second delay circuit, and
   wherein said variable capacitance element, the capacitance value of which varies depending upon the value of a signal at the output terminal, in place of a signal at the input terminal, is connected to an output of at least one unit delay element of said second delay circuit; and wherein
   when the waveform width of a signal at the input terminal, from one transition of a positive-going transition and a negative-going transition to the other one of the transitions, is greater than a total of the delay time of said first delay circuit and a delay time of said second delay circuit, the capacitance of the variable capacitance element is made a first value and delay of said second delay circuit is made relatively large with respect to said one transition, and the capacitance of the variable capacitance element is made a second value and the delay of said second delay circuit is made relatively small with respect to said other transition, whereby a signal having a reduced waveform width is output from the output terminal; and
   when the waveform width of the signal at the input terminal is less than or equal to the total of the delay time of said first delay circuit and the delay time of said second delay circuit, the capacitance of the variable capacitance element is made the same value with respect to said one transition and said other transition, whereby a signal not having a reduced waveform width is output from the output terminal.

6. The circuit according to claim 5, wherein the variable capacitance element comprises a MOS capacitor comprising a MOS transistor having a gate connected to an output of a unit delay element of the delay circuit and a source and drain coupled together and connected to the signal at the input terminal or to a signal that is the inverse of this signal.

7. The circuit according to claim 3, wherein the unit delay element comprises an inverter.

8. The circuit according to claim 1, wherein said circuit that separately controls delay includes an input terminal, a first inverter coupled between said input terminal and a first node, a second inverter coupled between said first node and an output terminal, and a first capacitor coupled between said first node and said input terminal.

9. The circuit according to claim 8, wherein said circuit that separately controls delay includes a delay circuit inserted between said input terminal and an input of said first inverter.

10. The circuit according to claim 8, wherein said circuit that separately controls delay includes a second capacitor coupled between a second node and said input terminal.

11. The circuit according to claim 10, wherein said first capacitor comprises a MOS capacitor having a first conductivity type and said second capacitor comprises a MOS capacitor having a second conductivity type opposite to said first conductivity type.

12. The circuit according to claim 11, wherein said circuit that separately controls delay includes a complementary signal generation circuit to supply said first capacitor and said second capacitor with complementary signals to each other.

13. The circuit according to claim 1, wherein said circuit that separately controls delay includes a first inverter coupled between an input terminal and a first node, a delay circuit having a predetermined delay time coupled between said first node and a second node, a second inverter coupled between said second node and a third node, a third inverter coupled between said third node and a fourth node, a fourth inverter coupled between said fourth node and an output terminal, and a fifth inverter coupled between said input terminal and a fifth node, a sixth inverter coupled between said fifth node and a sixth node, a first capacitor coupled between said third node and said fifth node, and
   a second capacitor coupled between said fourth node and said sixth node.

14. The circuit according to claim 1, wherein said circuit that separately controls delay includes an input terminal, a first inverter coupled between said input terminal and a first node, a second inverter coupled between said first node and an output terminal, and a first capacitor coupled between said first node and said output terminal.

15. The circuit according to claim 14, wherein said circuit that separately controls delay includes a delay circuit inserted between said output terminal and an output of said second inverter.

16. The circuit according to claim 14, wherein said circuit that separately controls delay includes a second capacitor coupled between an input of said first inverter and said output terminal.

17. The circuit according to claim 16, wherein said first capacitor comprises a MOS capacitor having a first conductivity type and said second capacitor comprises a MOS capacitor having a second conductivity type opposite to said first conductivity type.

18. The circuit according to claim 17, wherein said circuit that separately controls delay includes a complementary signal generation circuit to supply said first capacitor and said second capacitor with complementary signals to each other.

19. The circuit according to claim 1, wherein said circuit that separately controls delay includes a first inverter coupled between an input terminal and a first node, a second inverter coupled between said first node and a second node, a third inverter coupled between said second node and a third node, a fourth inverter coupled between said third node and a fourth node, a delay circuit having a predetermined delay time coupled between said fourth node and an output terminal, a fifth inverter coupled between said output terminal and a fifth node, a first capacitor coupled between said output terminal and said second node, and a second capacitor coupled between said fifth node and said third node.

20. The circuit according to claim 1, wherein said circuit that separately controls delay includes a first delay circuit having a first delay time coupled between an input terminal and a first node, a second delay circuit having a second delay time coupled between said first node and a second node, a selector coupled among said input terminal, said first node, said second node, and a third node, and said selector coupling one of said first node and said second node to said third node in response to a level of said input terminal, and a gate circuit coupled among said first node, said second node, and an output terminal.

21. The circuit according to claim 20, wherein said gate circuit comprises one of a NOR gate and a NAND gate.

22. The circuit according to claim 20, wherein said circuit that separately controls delay includes a first inverter inserted between said input terminal and an input of said first delay circuit.

23. The waveform width adjusting circuit according to claim 1, wherein said circuit includes a delay circuit connected between an input terminal receiving the input signal and an output terminal, and a delay adjusting circuit connected between the input terminal and the delay circuit for rendering said delay circuit to reduce a waveform width of the input signal in response to the input signal when the waveform width is greater than a predetermined length of time, and rendering said delay circuit not to reduce a waveform width of the input signal in response to the input signal when the waveform width of the input signal in response to the input signal when the waveform width is less than or equal to the predetermined length of time.

24. The waveform width adjusting circuit according to claim 2, wherein the delay adjusting circuit controls the changeover of adjustment of the waveform width in response to the input signal which is inputted to the delay adjusting circuit.

* * * * *